(12) United States Patent
Yang et al.

(10) Patent No.: US 7,706,149 B2
(45) Date of Patent: Apr. 27, 2010

(54) MICRO-ELECTRO-MECHANICAL-SYSTEM PACKAGE AND METHOD FOR MANUFACTURING THE SAME

(75) Inventors: Hsueh An Yang, Taipei (TW); Meng Jen Wang, Pingtung (TW); Wei Chung Wang, Kaohsiung County (TW); Ming Chiang Lee, Kaohsiung (TW); Wei Pin Huang, Kaohsiung (TW); Feng Chen Cheng, Kaohsiung (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 137 days.

(21) Appl. No.: 12/126,043

(22) Filed: May 23, 2008

(65) Prior Publication Data

US 2009/0046436 A1 Feb. 19, 2009

(30) Foreign Application Priority Data

Aug. 17, 2007 (TW) .............................. 96130400 A

(51) Int. Cl.
*H05K 1/11* (2006.01)
(52) U.S. Cl. .................... 361/792; 361/748; 73/754; 73/780; 257/723; 257/678
(58) Field of Classification Search ................. 361/792, 361/748; 73/754, 780; 257/723, 678
See application file for complete search history.

(56) References Cited

U.S. PATENT DOCUMENTS

| | | | |
|---|---|---|---|
| 7,198,981 B2 * | 4/2007 | Avramescu et al. | 438/107 |
| 7,270,012 B2 * | 9/2007 | Yokoyama et al. | 73/754 |
| 7,451,656 B2 * | 11/2008 | Yokoyama et al. | 73/754 |
| 7,540,199 B2 * | 6/2009 | Fujii et al. | 73/780 |
| 2006/0233400 A1 * | 10/2006 | Ohbayashi et al. | 381/175 |

* cited by examiner

*Primary Examiner*—Jinhee J Lee
*Assistant Examiner*—Xiaoliang Chen

(57) ABSTRACT

A MEMS package includes a first board, a second board and a laminate material. The first board includes a lower metallic trace, a metallic diaphragm and a through opening. The lower metallic trace is located on the lower surface of the first board, and the metallic diaphragm is disposed on the lower metallic trace. The second board includes an upper metallic trace and a metallic electrode. The upper metallic trace is located on the upper surface of the second board, the metallic electrode is disposed on the upper metallic trace, and the metallic electrode is corresponding to the metallic diaphragm. The laminate material is disposed between the lower and upper metallic traces, and includes a hollow portion for accommodating the metallic electrode and metallic diaphragm, wherein a sensing unit is formed by the metallic electrode, the hollow portion and the metallic diaphragm, and is corresponding to the through opening.

14 Claims, 6 Drawing Sheets

MICRO-ELECTRO-MECHANICAL-SYSTEM PACKAGE AND METHOD FOR MANUFACTURING THE SAME

CROSS REFERENCE TO RELATED APPLICATION

This application claims the priority benefit of Taiwan Patent Application Serial Number 096130400, filed Aug. 17, 2007, the full disclosure of which is incorporated herein by reference.

BACKGROUND OF THE INVENTION

1. Field of the Invention

The present invention generally relates to a MEMS package, and more particularly to a MEMS package including a first board, a second board and a third board formed by the manufacturing process of the PCB.

2. Description of the Related Art

Micro-electro-mechanical-system (MEMS) components are gradually applied to many electronic circuits and a variety of micro sensors. For example, the MEMS components can be electro-mechanical motors, radio frequency (RF) switches, pressure transducers and accelerometers.

Referring to FIG. 1, it depicts a conventional microphone-type MEMS package 10. The package 10 includes a silicon substrate 12, an annular supporting wall 14, a capacitor 16, an operation element 18 and a cap 20. A cavity 22 is formed by the annular supporting wall 14 and the silicon substrate 12. The capacitor 16 and the operation element 18 are mounted on the silicon substrate 12 and located in the cavity 22. The cap 20 is mounted on the annular supporting wall 14 and covers the cavity 22. The cap 20 includes a through hole 24 for conveying external sound into the package. The capacitor 16 is a MEMS component and corresponding to the through hole 24, whereby the capacitor 16 is adapted to be driven by sound so as to receive a vibration signal. The operation element 18 converts a non-electric signal to an electric signal. The capacitor 16 is constituted by two metallic thin films (not shown) and a dielectric layer (not shown) located between the two metallic thin films, and thus it is necessary that the capacitor 16 is formed on the silicon substrate 12 by a plurality of photo-mask, photolithography and etching processes. However, the manufacture cost is high because the package is formed by the above-mentioned photo-mask, photolithography and etching processes.

Accordingly, there exists a need for a MEMS package and a method for manufacturing the same, being capable of solving the above-mentioned problems.

SUMMARY OF THE INVENTION

It is an object of the present invention to provide a MEMS package including a first board, a second board and a third board formed by the manufacturing process of the PCB so as to have a lower manufacture cost.

It is another object of the present invention to provide a MEMS package, wherein the thicker the electro-plating layers of the metallic diaphragm and the metallic electrode after the electro-plating processes, the smaller is the gap between the metallic diaphragm and the metallic electrode.

It is a further object of the present invention to provide a MEMS package, wherein the third upper and lower metallic layers of the third board are located on the upper and lower surfaces of the third board respectively, and thus the third board serves as an electro-magnetic shield for the MEMS package.

In order to achieve the foregoing object, the present invention provides a micro-electro-mechanical-system (MEMS) package, including a first board, a second board and a laminate material. The first board has an upper surface and a lower surface and comprising a first lower metallic trace, a metallic diaphragm and a first through opening, wherein the lower surface is opposite to the upper surface, the first lower metallic trace is located on the lower surface of the first board, the metallic diaphragm is disposed on the first lower metallic trace, and the first through opening is extended from the upper surface to the lower surface. The second board has an upper surface and a lower surface and comprising an second upper metallic trace and a metallic electrode, wherein the lower surface is opposite to the upper surface, the second upper metallic trace is located on the upper surface of the second board, the metallic electrode is disposed on the second upper metallic trace, and the metallic electrode is corresponding to the metallic diaphragm. The laminate material is disposed between the first lower metallic trace and the second upper metallic trace, and comprising a hollow portion for accommodating the metallic diaphragm and the metallic electrode, wherein a sensing unit is formed by the metallic diaphragm, the hollow portion and the metallic electrode and is corresponding to the first through opening. The MEMS package further includes a chip and an encapsulant. The chip is mounted on the upper surface of the first board and electrically connected to the metallic diaphragm and the metallic electrode. The encapsulant is adapted to seal the chip and have a second through opening, wherein the second through opening is corresponding to the first through opening. The MEMS package further includes a third board mounted on the encapsulant and comprises a through hole corresponding to the second through opening.

All of the first, second and third boards of the present invention include metallic layers or metallic traces located on the upper and lower surfaces respectively. Particularly, the first and second boards include the metallic diaphragm and metallic electrode respectively. Thus, materials and manufacturing processes of the first, second and third boards are similar to those of a typical printed circuit board (PCB). Compared with the conventional MEMS package formed by a plurality of photo-mask, photolithography and etching processes, the MEMS package of the present invention formed by the manufacturing process of the PCB has a lower manufacture cost. Furthermore, the thicker the electro-plating layers of the metallic diaphragm and the metallic electrode after the electro-plating processes, the smaller is the gap between the metallic diaphragm and the metallic electrode, whereby the value of the gap between the metallic diaphragm and the metallic electrode must be less than a predetermined value. In addition, the third upper and lower metallic layers of the third board are located on the upper and lower surfaces respectively, and thus the third board serves as an electro-magnetic shield for the MEMS package.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
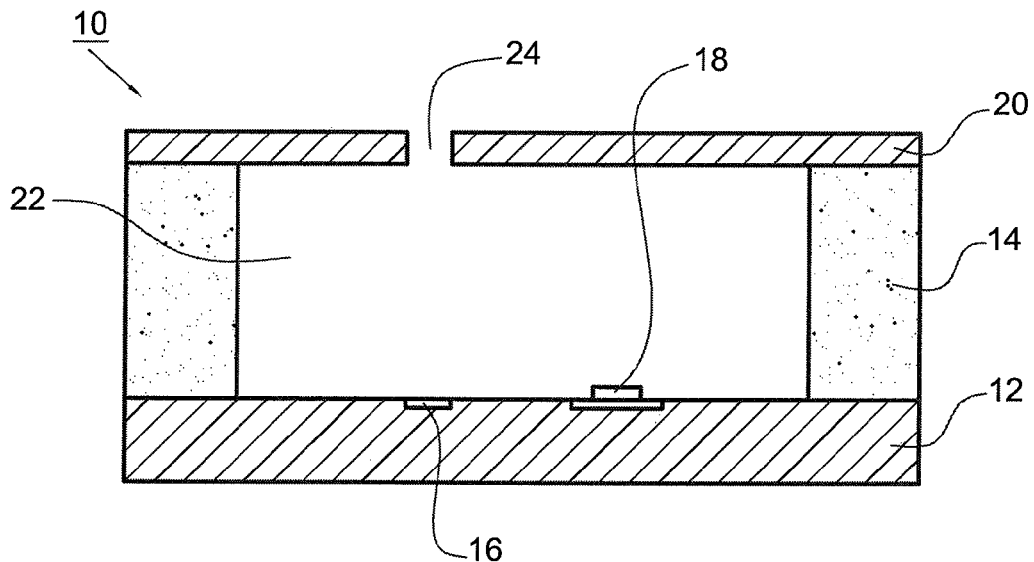
FIG. 1 is a cross-sectional view of a microphone-type MEMS package in the prior art.
Figure 2:
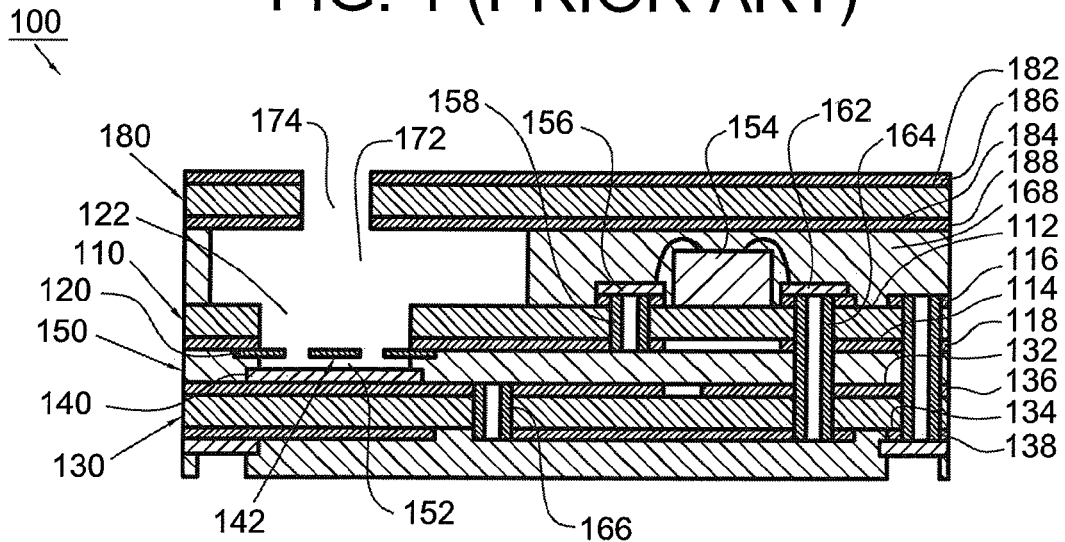
FIG. 2 is a cross-sectional view of a MEMS package according to an embodiment of the present invention.

Referring to FIG. 2, it depicts a micro-electro-mechanical-system (MEMS) package 100 according to an embodiment of the present invention. The MEMS package 100 includes a first board 110, a second board 130 and a laminate material 150. The first board 110 has an upper surface 112 and a lower surface 114, wherein the lower surface 114 is opposite to the upper surface 112. The first board 110 includes a first upper metallic trace 116, a first lower metallic trace 118, a metallic diaphragm 120 and a first through opening 122, wherein the first upper metallic trace 116 is located on the upper surface 112, the first lower metallic trace 118 is located on the lower surface 114, the metallic diaphragm 120 is disposed on the first lower metallic trace 118, and the first through opening 122 is extended from the upper surface 112 to the lower surface 114. The first upper metallic trace 116 and the first lower metallic trace 118 can be made of copper. The metallic diaphragm 120 can be made of nickel (Ni) and gold (Au), and be formed on the first lower metallic trace 118 by two electro-plating processes. The first board 110 can be made of bismaleimide triazine (BT) resin.

The second board 130 has an upper surface 132 and a lower surface 134, wherein the lower surface 134 is opposite to the upper surface 132. The second board 130 includes a second upper metallic trace 136, a second lower metallic trace 138 and a metallic electrode 140, wherein the second upper metallic trace 136 is located on the upper surface 132, the second lower metallic trace 138 is located on the lower surface 134, the metallic electrode 140 is disposed on the second upper metallic trace 136, and the metallic electrode 140 is corresponding to the metallic diaphragm 120. The metallic electrode 140 can be made of nickel (Ni) and gold (Au), and be formed on the second upper metallic trace 136 by two electro-plating processes. The second upper metallic trace 136 and the second lower metallic trace 138 can be made of copper. The second board 130 can be made of bismaleimide triazine (BT) resin.

Figure 3A:
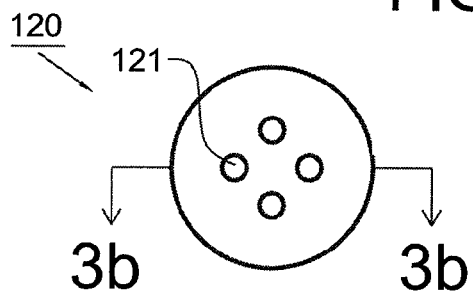
FIGS. 3a and 3b are plane and cross-sectional views of a metallic diaphragm according to the embodiment of the present invention.
Figure 3B:
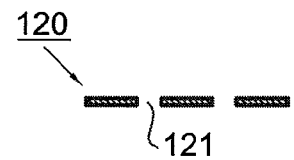

The laminate material 150 is disposed between the first lower metallic trace 118 and the second upper metallic trace 136, and includes a hollow portion 152 for accommodating the metallic diaphragm 120 and the metallic electrode 140. The laminate material 150 can be made of polypropylene (PP) resin. A sensing unit 142 is formed by the metallic diaphragm 120, the hollow portion 152 and the metallic electrode 140, and the sensing unit 142 is corresponding to the first through opening 122 of the first board 110. The sensing unit 142 can be driven by sound so as to receive a vibration signal. The sensing unit 142 is a MEMS component, e.g. a capacitor formed by the metallic diaphragm 120, the hollow portion 152 and the metallic electrode 140. Referring to FIGS. 3a and 3b, the metallic diaphragm 120 includes a plurality of through holes 121, which is sound-permeable, thereby further effec-tively driving the metallic diaphragm 120 so as to receive the vibration signal. More detailed, according to the formula of capacitance:

$$C = (\in A)/d$$

The value of capacitance C is directly proportional to the area A of the metallic diaphragm 120 or the metallic electrode 140 and the dielectric constant $\in$ of a dielectric material, and the value of capacitance C is inversely proportional to the gap d between the metallic diaphragm 120 and the metallic electrode 140. Thus, the variation in the gap between the metallic diaphragm 120 and the metallic electrode 140 resulted from the vibration of sound generates the variation in the value of capacitance. In other words, the variation in the gap between the metallic diaphragm 120 and the metallic electrode 140 resulted from the vibration of sound can be calculated by the variation in the value of capacitance, thereby further obtaining the magnitude of a vibration signal. Furthermore, the value of the gap between the metallic diaphragm 120 and the metallic electrode 140 must be less than a predetermined value, e.g. 25 μm, thereby causing the value of capacitance to have enough variation so as to conveniently calculate the variation in the value of capacitance. The metallic diaphragm 120 and the metallic electrode 140 of the present invention are formed by electro-plating processes, and thus the gap between the metallic diaphragm 120 and the metallic electrode 140 depends on the thicknesses of electro-plating layers of the metallic diaphragm 120 and the metallic electrode 140 after the electro-plating processes. In other words, the thicker the electro-plating layers of the metallic diaphragm 120 and the metallic electrode 140 after the electro-plating processes, the smaller is the gap between the metallic diaphragm 120 and the metallic electrode 140, whereby the value of the gap between the metallic diaphragm 120 and the metallic electrode 140 must be less than the predetermined value.

Referring to FIG. 2 again, a chip (e.g. an operation element) 154 is mounted on the upper surface 112 of the first board 110 and electrically connected to the metallic diaphragm 120 and the metallic electrode 140 for calculating the variation in the value of capacitance and further obtaining the magnitude of a vibration signal. More detailed, the chip 154 can be electrically connected to the metallic diaphragm 120 through a pad 156, the first upper metallic trace 116, a plating through hole (PTH) 158 and the first lower metallic trace 118 in sequence by a wire bonding process or a flip chip bonding process. Furthermore, the chip 154 can be electrically connected to the metallic electrode 140 through a pad 162, the first upper metallic trace 116, a PTH 164, the second lower metallic trace 138, a PTH 166 and the second upper metallic trace 136 in sequence. Otherwise, the chip 154 can be electrically connected to the metallic electrode 140 through a pad 162, the first upper metallic trace 116, a PTH (not shown) and the second upper metallic trace 136 in sequence.

An encapsulant 168 is adapted to seal the chip 154 and has a second through opening 172, wherein the second through opening 172 is corresponding to the first through opening 122.

A third board 180 is mounted on the encapsulant 168 and includes a through hole 174, which is corresponding to the second through opening 172. The third board 180 has an upper surface 182 and a lower surface 184, wherein the lower surface 184 is opposite to the upper surface 182. Also, the third board 180 includes a third upper metallic layer 186 and a third lower metallic layer 188, wherein the third upper metallic layer 186 is located on the upper surface 182, and the third lower metallic layer 188 is located on the lower surface 184. Thus, the third board 180 serves as an electro-magnetic shield for the MEMS package 100. The third upper metallic layer 186 and the third lower metallic layer 188 can be made of copper. The third board 180 can be made of bismaleimide triazine (BT) resin.

All of the first, second and third boards of the present invention include metallic layers or metallic traces located on the upper and lower surfaces respectively. Particularly, the first and second boards include the metallic diaphragm and metallic electrode respectively. Thus, materials and manufacturing processes of the first, second and third boards are similar to those of a typical printed circuit board (PCB). Compared with the conventional MEMS package formed by a plurality of photo-mask, photolithography and etching processes, the MEMS package of the present invention formed by the manufacturing process of the PCB has a lower manufacture cost.

Figure 4:
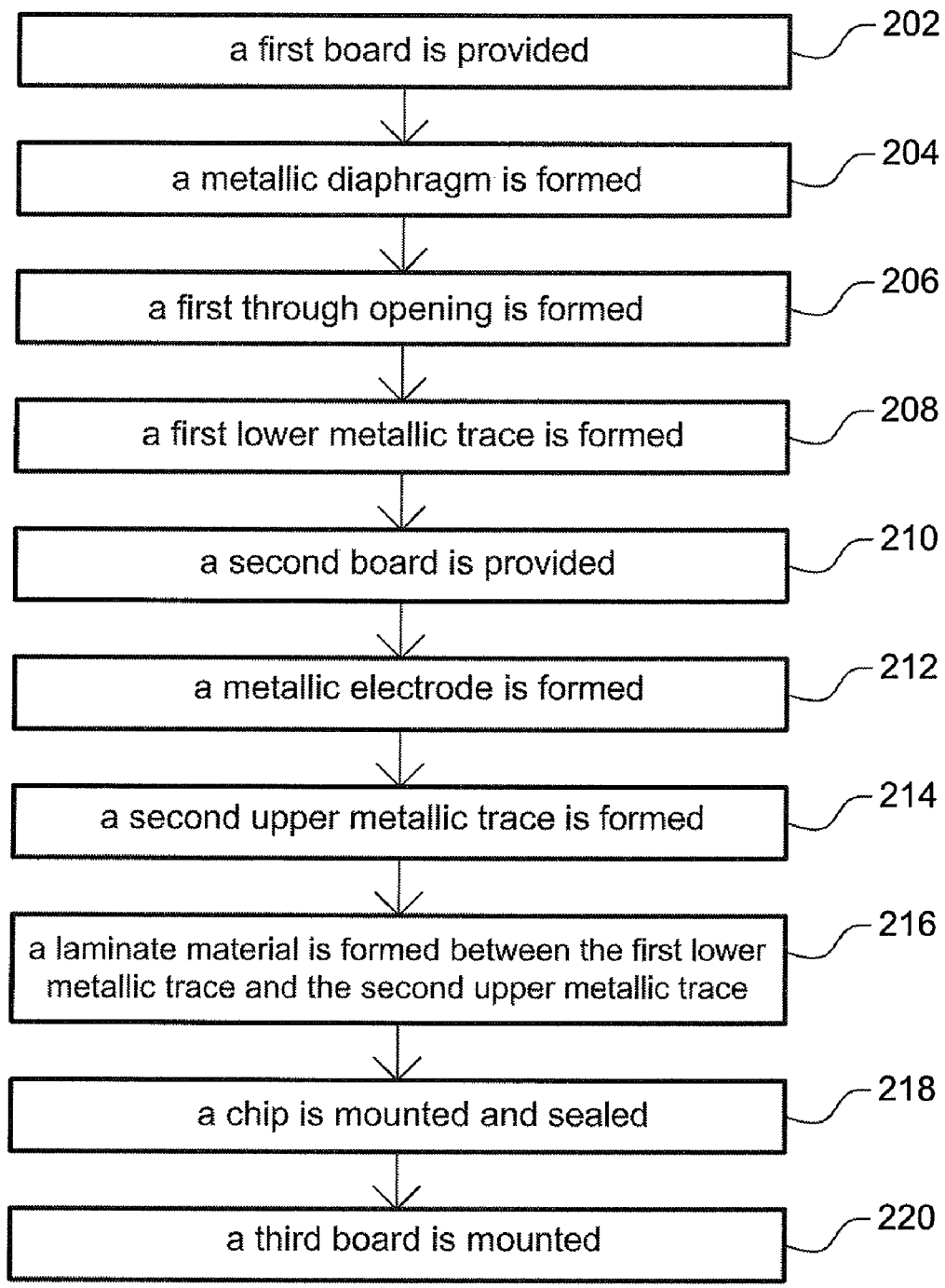
FIG. 4 is a flow diagram showing a method for manufacturing the MEMS packages according to the embodiment of the present invention.
Figure 5:
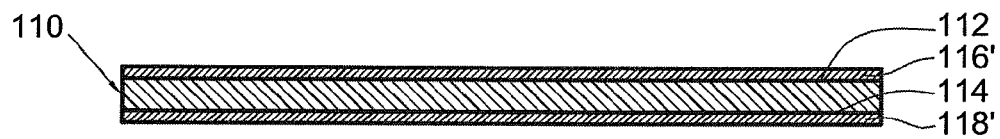
FIGS. 5 to 15 are cross-sectional views showing the method for manufacturing the MEMS packages according to the embodiment of the present invention.
Figure 6:
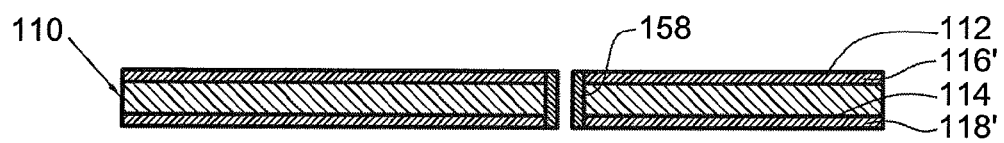
Figure 7:
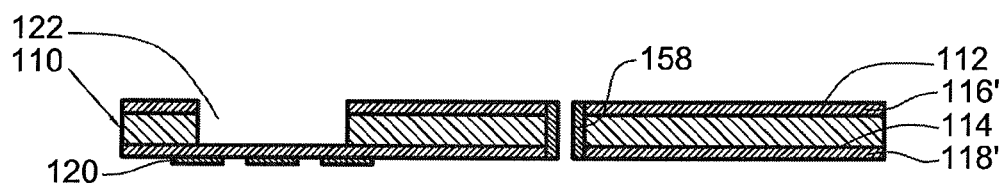
Figure 8:
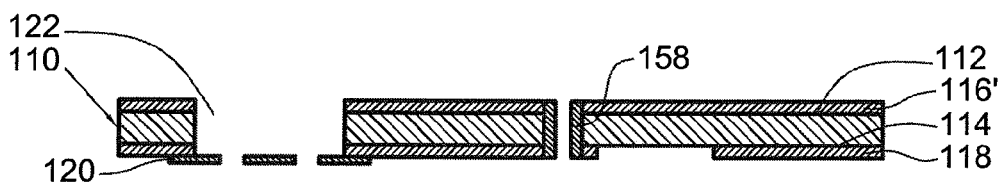

Referring to FIG. 4, it depicts a method for manufacturing micro-electro-mechanical-system (MEMS) packages 100 according to the embodiment of the present invention. In step 202, a first board 110 is provided, wherein the first board 110 has an upper surface 112 and a lower surface 114, and includes a first upper metallic layer 116' located on the upper surface 112 and a first lower metallic layer 118' located on the lower surface 114 respectively, shown in FIG. 5. Then, a plating through hole (PTH) 158 is formed between the upper surface 112 and the lower surface 114 for electrically connecting the first upper metallic layer 116' to the first lower metallic layer 118', shown in FIG. 6. In step 204, a metallic diaphragm 120 is formed on the first lower metallic layer 118', shown in FIG. 7. The metallic diaphragm 120 can be made of nickel (Ni) and gold (Au), and be formed on the first lower metallic trace 118' by two electro-plating processes. Then, a plurality of through holes 121 are formed in the metallic diaphragm 120 by a drilling process, e.g. a mechanical drilling process. In step 206, a first through opening 122 is formed and extended from the first upper metallic layer 116' located on the upper surface 112 to the lower surface 114 by a drilling process, e.g. a laser drilling process, shown in FIG. 7. In step 208, the first lower metallic layer 118' is patterned to a first lower metallic trace 118, and the first lower metallic layer 118' located in the first through opening 122 is removed, shown in FIG. 8.

Figure 9:
Figure 10:
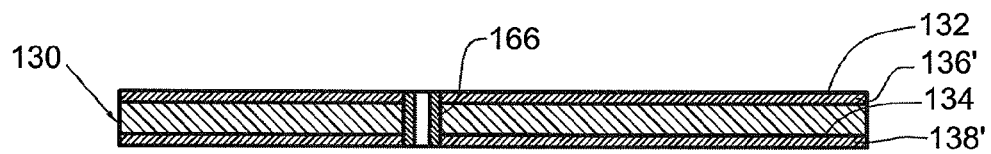
Figure 11:
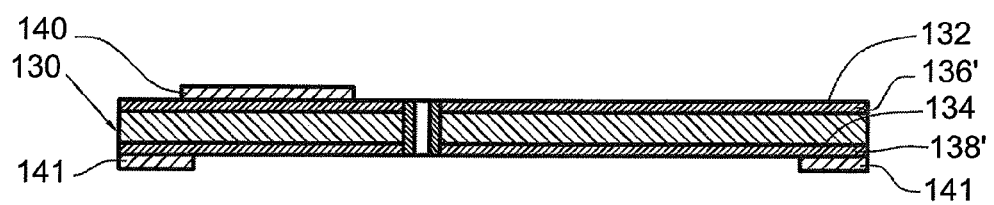
Figure 12:
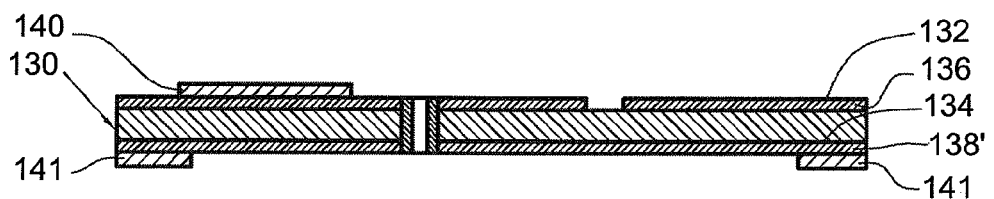

In step 210, a second board 130 is provided, wherein the second board 130 has an upper surface 132 and a lower surface 134, and includes a second upper metallic layer 136' located on the upper surface 132 and a second lower metallic layer 138' located on the lower surface 134 respectively, shown in FIG. 9. Then, a PTH 166 is formed between the upper surface 132 and the lower surface 134 for electrically connecting the second upper metallic layer 136' to the second lower metallic layer 138', shown in FIG. 10. In step 212, a metallic electrode 140 is formed on the second upper metallic layer 136'. The metallic electrode 140 can be made of nickel (Ni) and gold (Au), and be formed on the second upper metallic layer 136' by two electro-plating processes. Simultaneously pads 140 are formed on the second lower metallic layer 138' by the same electro-plating processes. In step 214, the second upper metallic layer 136' is patterned to a second upper metallic trace 136, shown in FIG. 12.

Figure 13A:
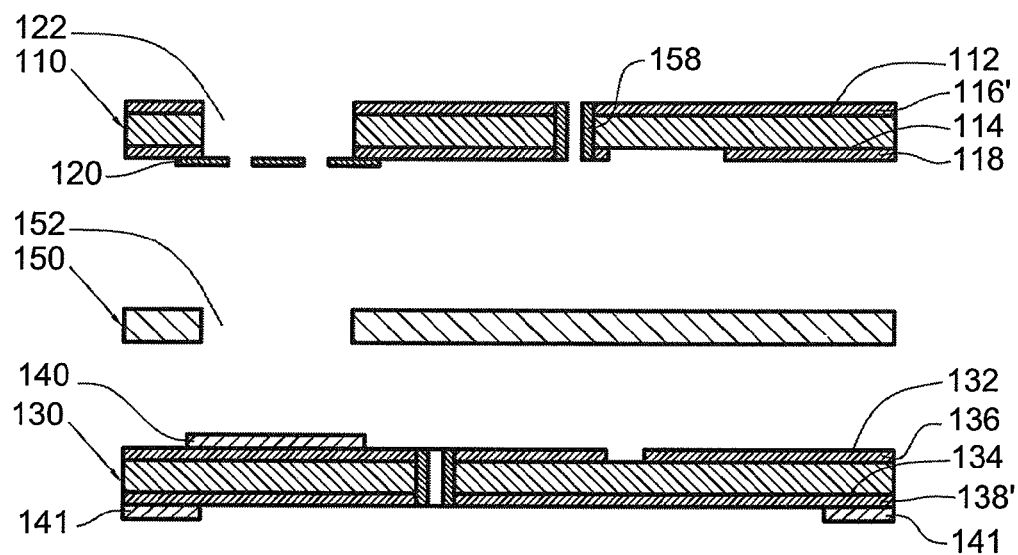
Figure 13B:
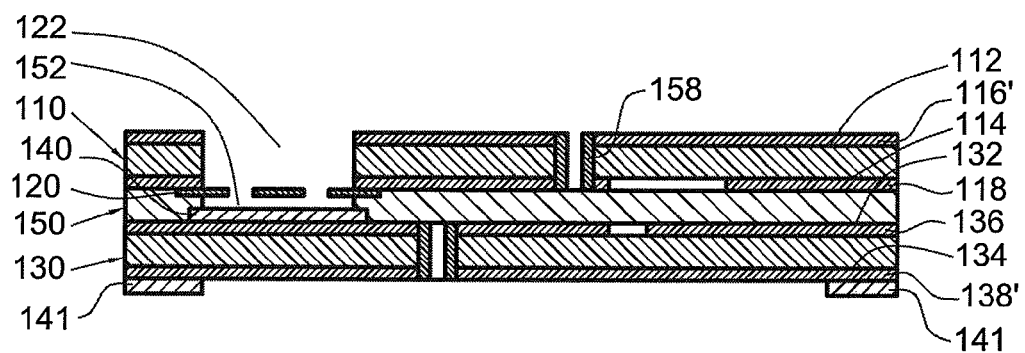

In step 216, a laminate material 150 is formed between the first lower metallic trace 118 and the second upper metallic trace 136 by a laminating process, shown in FIGS. 13a and 13b. The laminate material 150 includes a hollow portion 152 for accommodating the metallic diaphragm 120 and the metallic electrode 140. The metallic electrode 140 is corresponding to the metallic diaphragm 120. A sensing unit 142 is formed by the metallic diaphragm 120, the hollow portion 152 and the metallic electrode 140, and the sensing unit 142 is corresponding to the first through opening 122 of the first board 110. The gap between the metallic diaphragm 120 and the metallic electrode 140 depends on the thicknesses of electro-plating layers of the metallic diaphragm 120 and the metallic electrode 140 after the electro-plating processes. Thus, the thicker the electro-plating layers of the metallic diaphragm 120 and the metallic electrode 140 after the electro-plating processes, the smaller is the gap between the metallic diaphragm 120 and the metallic electrode 140.

Figure 14:
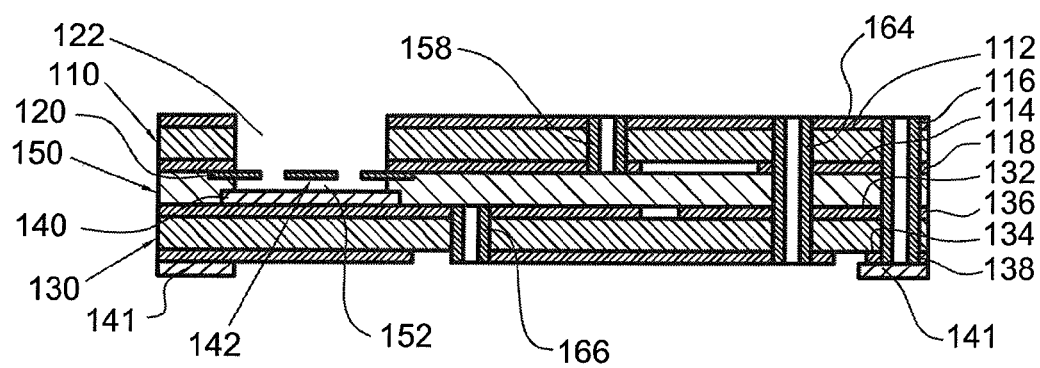
Figure 15:
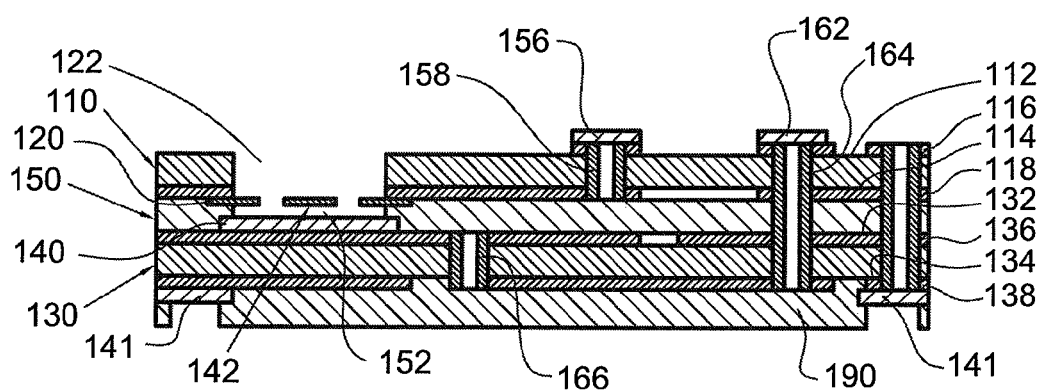

Then, two PTHs 164, 165 are formed and pass through the first board 110, the laminate material 150 and the second board 130, wherein the PTH 164 electrically connects the first upper metallic layer 116' to the second lower metallic layer 138', and the PTH 165 electrically connects the first upper metallic layer 116' to the pads 141, shown in FIG. 14. Then, two pads 156, 162, are formed on the first upper metallic layer 116'. The first upper metallic layer 116' and the second lower metallic layer 138' are patterned to a first upper metallic trace 116 and a second lower metallic trace 138 respectively. A solder mask 190 is formed on the second lower metallic trace 138 and exposes the pads 141, shown in FIG. 15.

In step 218, a chip 154 is mounted on the upper surface 112 of the first board 110 and electrically connected to the metallic diaphragm 120 and the metallic electrode 140, shown in FIG. 2. An encapsulant 168 is provided for sealing the chip 154, and has a second through opening 172, wherein the second through opening 172 is corresponding to the first through opening 122, shown in FIG. 2. In step 220, a third board 180 is mounted on the encapsulant 168, shown in FIG. 2. The third board 180 includes a through hole 174, which is corresponding to the second through opening 172. The third board 180 has an upper surface 182 and a lower surface 184, wherein the lower surface 184 is opposite to the upper surface 182. Also, the third board 180 includes a third upper metallic layer 186 located on the upper surface 182 and a third lower metallic layer 188 located on the lower surface 184 respectively. Thus, the third board 180 serves as an electro-magnetic shield for the MEMS package 100.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A micro-electro-mechanical-system (MEMS) package comprising:
a first board having an upper surface and a lower surface and comprising a first lower metallic trace, a metallic diaphragm and a first through opening, wherein the lower surface is opposite to the upper surface, the first lower metallic trace is located on the lower surface of the first board, the metallic diaphragm is disposed on the first lower metallic trace, and the first through opening is extended from the upper surface to the lower surface;
a second board having an upper surface and a lower surface and comprising a second upper metallic trace and a metallic electrode, wherein the lower surface is opposite to the upper surface, the second upper metallic trace is located on the upper surface of the second board, the metallic electrode is disposed on the second upper metallic trace, and the metallic electrode is corresponding to the metallic diaphragm;
a laminate material disposed between the first lower metallic trace and the second upper metallic trace, and comprising a hollow portion for accommodating the metallic diaphragm and the metallic electrode, wherein a sensing unit is formed by the metallic diaphragm, the hollow portion and the metallic electrode and is corresponding to the first through opening;

a chip mounted on the upper surface of the first board and electrically connected to the metallic diaphragm and the metallic electrode; and an encapsulant adapted to seal the chip and have a second through opening, wherein the second through opening is corresponding to the first through opening.

2. The MEMS package as claimed in claim 1, further comprising:

a third board mounted on the encapsulant and comprising a through hole corresponding to the second through opening, wherein the third board has an upper surface and a lower surface, the lower surface is opposite to the upper surface, and the third board comprises a third upper metallic layer located on the upper surface and a third lower metallic layer located on the lower surface respectively.

3. The MEMS package as claimed in claim 2, wherein the third upper metallic layer and the third lower metallic layer are made of copper.

4. The MEMS package as claimed in claim 1, wherein the first board further comprises a first upper metallic trace and a first plating through hole, and the chip is electrically connected to the metallic diaphragm through the first upper metallic trace, the first plating through hole and the first lower metallic trace in sequence.

5. The MEMS package as claimed in claim 4, further comprising:

a second plating through hole, wherein the chip is electrically connected to the metallic electrode through the first upper metallic trace, the second plating through hole and the second upper metallic trace in sequence.

6. The MEMS package as claimed in claim 4, wherein the first upper metallic trace, the first lower metallic trace and the second upper metallic trace are made of copper.

7. The MEMS package as claimed in claim 1, wherein the metallic diaphragm and the metallic electrode are made of nickel (Ni) and gold (Au).

8. The MEMS package as claimed in claim 1, wherein the value of the gap between the metallic diaphragm and the metallic electrode is less than 25 μm.

9. The MEMS package as claimed in claim 1, wherein the metallic diaphragm comprises a plurality of through holes.

10. A micro-electro-mechanical-system (MEMS) package comprising:

a first board comprising a metallic diaphragm and a first through opening;

a second board comprising a metallic electrode, wherein the metallic electrode is corresponding to the metallic diaphragm;

a laminate material disposed between the first board and the second board, and comprising a hollow portion for accommodating the metallic diaphragm and the metallic electrode, wherein a sensing unit is formed by the metallic diaphragm, the hollow portion and the metallic electrode and is corresponding to the first through opening;

a chip mounted on the first board and electrically connected to the metallic diaphragm and the metallic electrode;

an encapsulant adapted to seal the chip and has a second through opening, wherein the second through opening is corresponding to the first through opening; and a third board mounted on the encapsulant and comprising a through hole corresponding to the second through opening, wherein the third board has an upper surface and a lower surface, the lower surface is opposite to the upper surface, and the third board comprises a third upper metallic layer located on the upper surface and a third lower metallic layer located on the lower surface respectively.

11. The MEMS package as claimed in claim 10, wherein the third upper metallic layer and the third lower metallic layer are made of copper.

12. The MEMS package as claimed in claim 10, wherein the metallic diaphragm and the metallic electrode are made of nickel (Ni) and gold (Au).

13. The MEMS package as claimed in claim 10, wherein the value of the gap between the metallic diaphragm and the metallic electrode is less than 25 μm.

14. The MEMS package as claimed in claim 10, wherein the metallic diaphragm comprises a plurality of through holes.

* * * * *